United States Patent
Schmidt et al.

(10) Patent No.: US 12,034,424 B2
(45) Date of Patent: Jul. 9, 2024

(54) METHOD FOR THE RECONFIGURATION OF A VORTEX DENSITY IN A RARE EARTH MANGANATE, A NON-VOLATILE IMPEDANCE SWITCH AND USE THEREOF

(71) Applicant: HELMHOLTZ-ZENTRUM DRESDEN—ROSSENDORF E.V., Dresden (DE)

(72) Inventors: Heidemarie Schmidt, Dresden (DE); Nan Du, Jena (DE); Agnieszka Bogusz, Dresden (DE); Stephan Krüger, Dresden (DE); Ilona Skorupa, Dresden (DE)

(73) Assignee: HELMHOLTZ-ZENTRUM DRESDEN—ROSSENDORF E.V., Dresden (DE)

( * ) Notice: Subject to any disclaimer, the term of this patent is extended or adjusted under 35 U.S.C. 154(b) by 818 days.

(21) Appl. No.: 17/058,363

(22) PCT Filed: May 7, 2019

(86) PCT No.: PCT/EP2019/061717
§ 371 (c)(1),
(2) Date: Nov. 24, 2020

(87) PCT Pub. No.: WO2019/223999
PCT Pub. Date: Nov. 28, 2019

(65) Prior Publication Data
US 2021/0305961 A1 Sep. 30, 2021

(30) Foreign Application Priority Data
May 25, 2018 (DE) .................. 10 2018 112 605.0

(51) Int. Cl.
*H01F 1/03* (2006.01)
*H01H 36/00* (2006.01)
*H03H 7/01* (2006.01)

(52) U.S. Cl.
CPC .............. *H03H 7/01* (2013.01); *H01H 36/00* (2013.01); *H01F 1/0317* (2013.01)

(58) Field of Classification Search
CPC ......... H03H 7/01; H01H 36/00; H01F 1/0317
(Continued)

(56) References Cited

U.S. PATENT DOCUMENTS

| 2009/0257106 | A1 | 10/2009 | Tan et al. |
| 2014/0014946 | A1 | 1/2014 | Gurtej et al. |
| 2018/0190436 | A1* | 7/2018 | Duwel ...................... C09K 5/06 |

OTHER PUBLICATIONS

[http://dx.doi.org/10.1063/1.4899188] Resistive switching in polycrystalline YMnO3 thin films A. Bogusz; A. D. Müller; D. Blaschke; I. Skorupa; D. Bürger; A. Scholz; O. G. Schmidt; H. Schmidt AIP Advances 4, 107135 (2014) (Year: 2014).*

(Continued)

*Primary Examiner* — Igwe U Anya
(74) *Attorney, Agent, or Firm* — Heslin, Rothenberg Farley & Mesiti P.C.; Nicholas Mesiti

(57) ABSTRACT

A method for reconfiguration of a vortex density in a rare earth manganate, to a non-volatile impedance switch having reconfigurable impedance, and to the use thereof as microinductance is disclosed. A unique voltage-time profile is applied between a first and a second electrically conductive contact attached to the rare earth manganate, such that the rare earth manganate passes through an ordering temperature in a region of an electric field forming between the two electrically conductive contacts during a cooling process during and after application of the voltage pulse or the voltage ramp, and the vortex density is thus influenced and (Continued)

Figure 3:
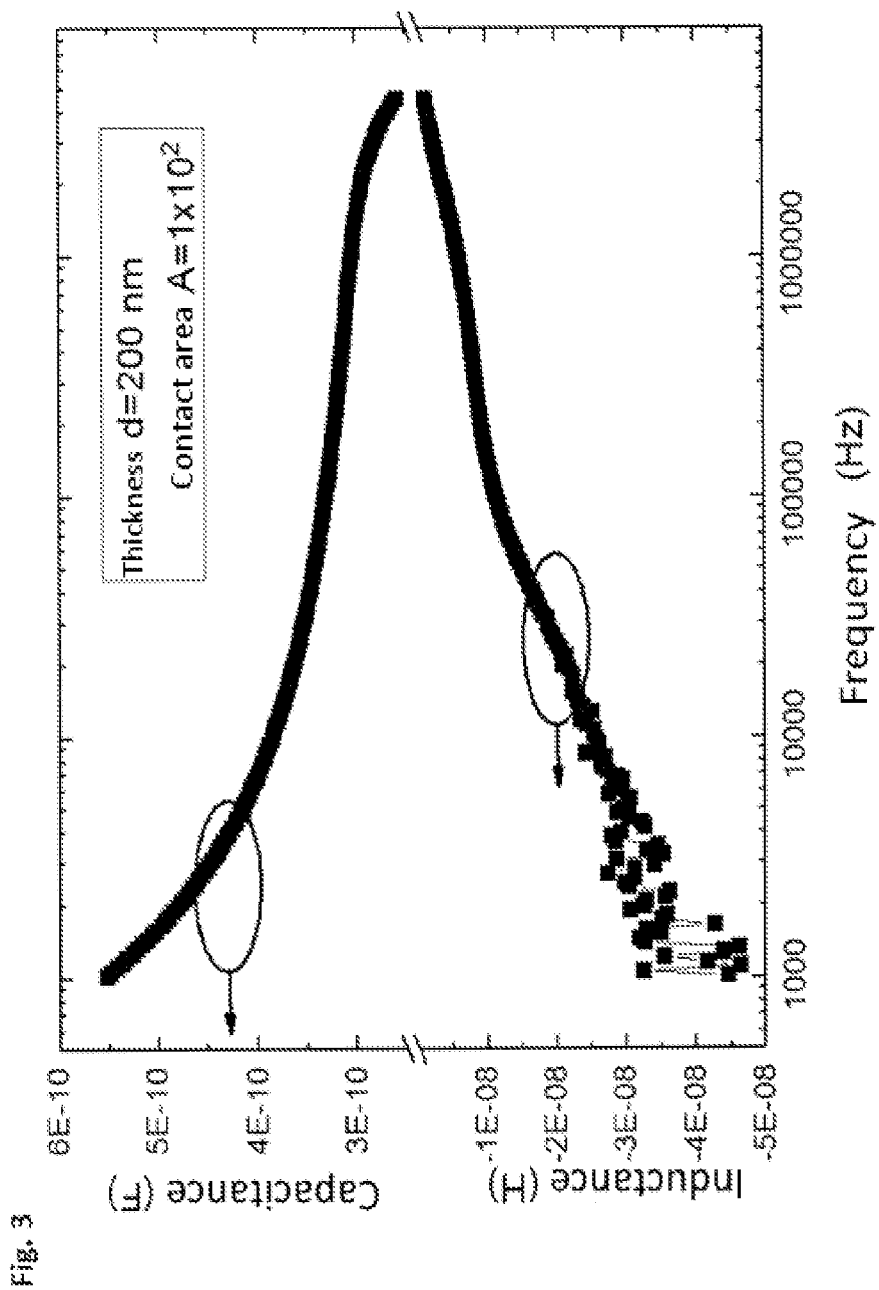

adjusted locally in the region of the electric field forming between the two electrically conductive contacts.

20 Claims, 13 Drawing Sheets

(58) Field of Classification Search
USPC .......................................................... 257/277
See application file for complete search history.

(56) References Cited

OTHER PUBLICATIONS

Investigations on the Electronic Excitations through Spectroscopic Measures for Resistive Switching Character of Manganite Thin Films, Kunalsinh N. Rathod et al. (Year: 2019).*
International Search Report and Written Opinion issued in PCT/EP2019/061717 and mailed Sep. 12, 2019.
A. Bogusz et al., "Resistive switching in polycrystalline YMnO3thin films", AIP Advances, American Institute of Physics, Oct. 20, 2014.
Z. B. Yan et al., "Unipolar resistive switching effect in YMn-1-[delta]O3 thin films", Applied Physics Letters, AIP Publishing LLC, US Jan. 5, 2010.
Q. N. Meir et al., "Global formation of topological defects in the multiferroic hexagonal manganites", arxiv.org, Cornell University Library, Mar. 24, 2017.
E. Ruff et al., "Conductivity Contrast and Tunneling Charge Transport in the Vortexlike Ferroelectric Domain Patterns of Multiferroic Hexagonal YMnO3", Physical Review Letters, Jan. 1, 2017.
S. M. Griffin et al., "From multiferroics to cosmology: Scaling behavior and beyond in the hexagonal manganites", Phys. Rev. X 2, 041022, 2012.
Q. Zhang, et al., "Multiferroic Vortex Domains in YMnO3", Scientific Reports, 3 : 2741 | DOI: 10.1038/srep02741.
F. Ellinger, "Radio Frequency Integrated Circuits and Technologies", Springer-Verlag Berlin Heidelberg, 2008.

* cited by examiner

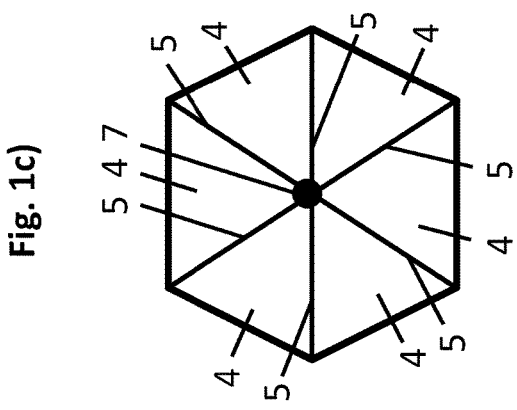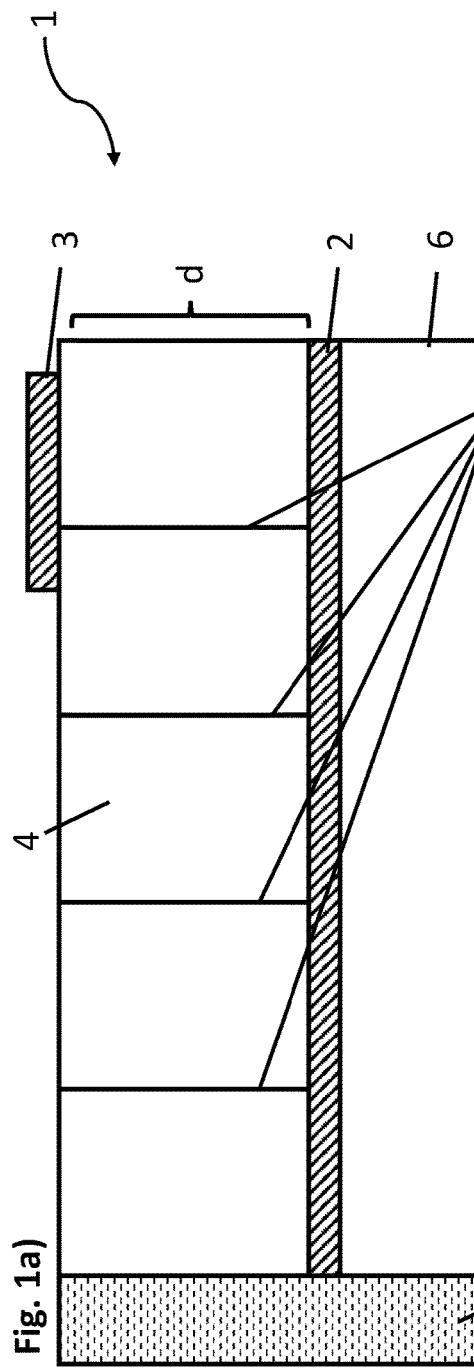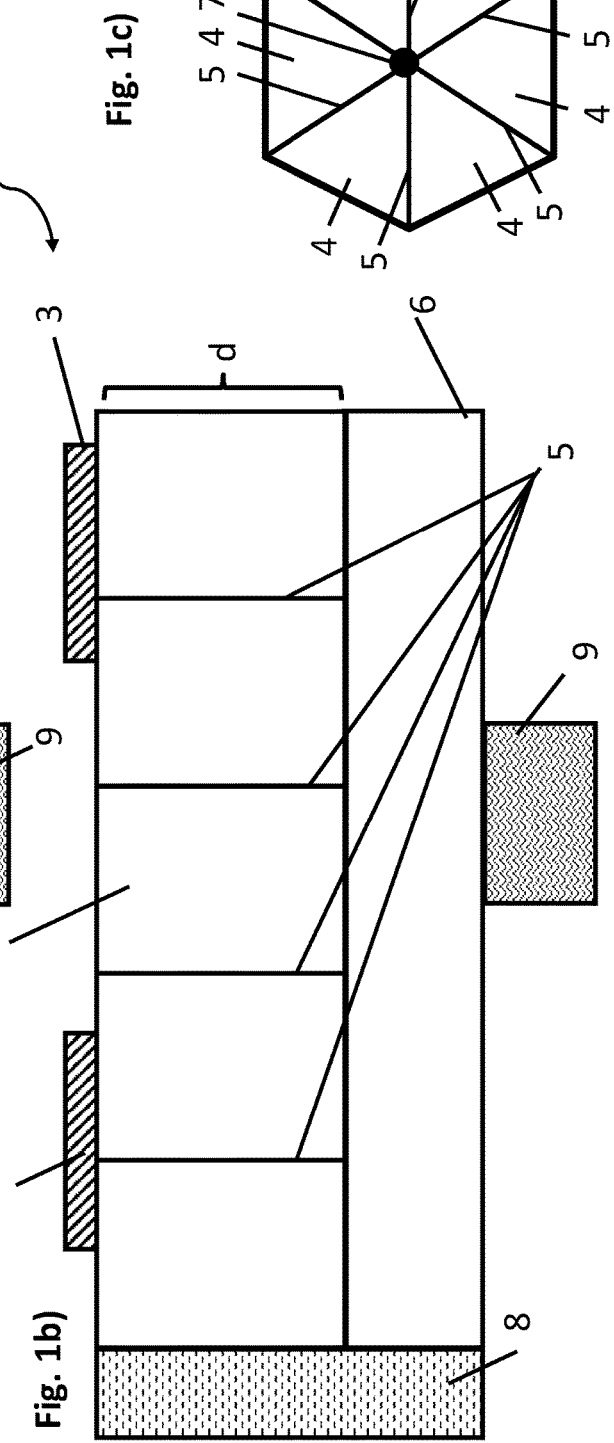

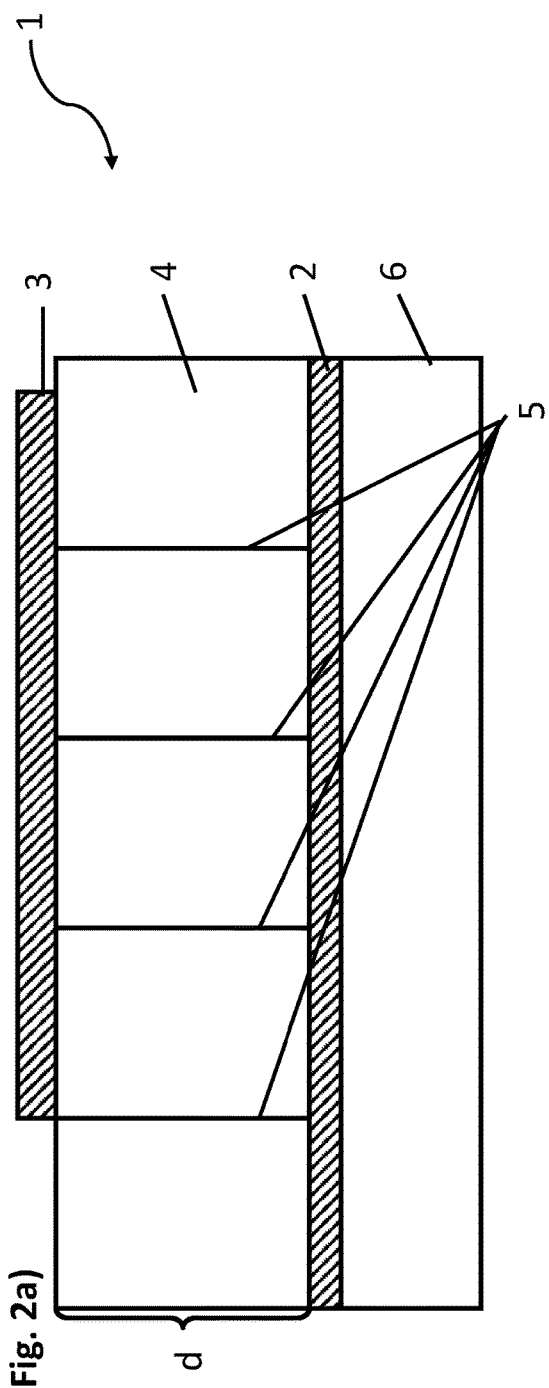
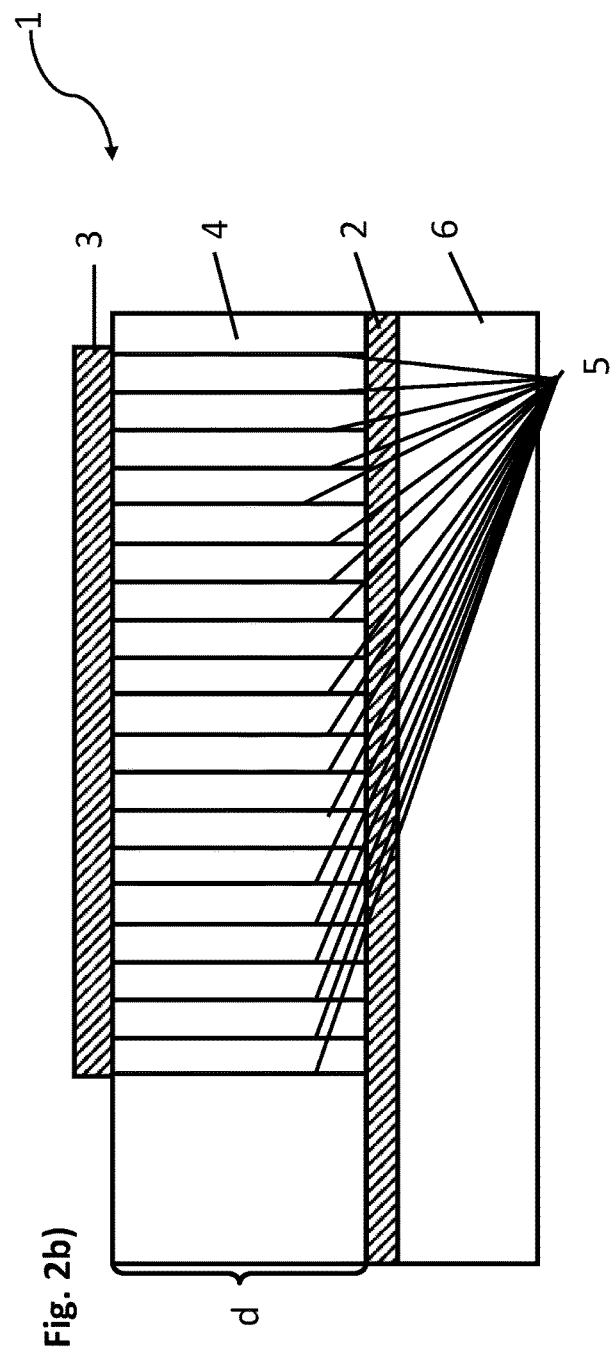

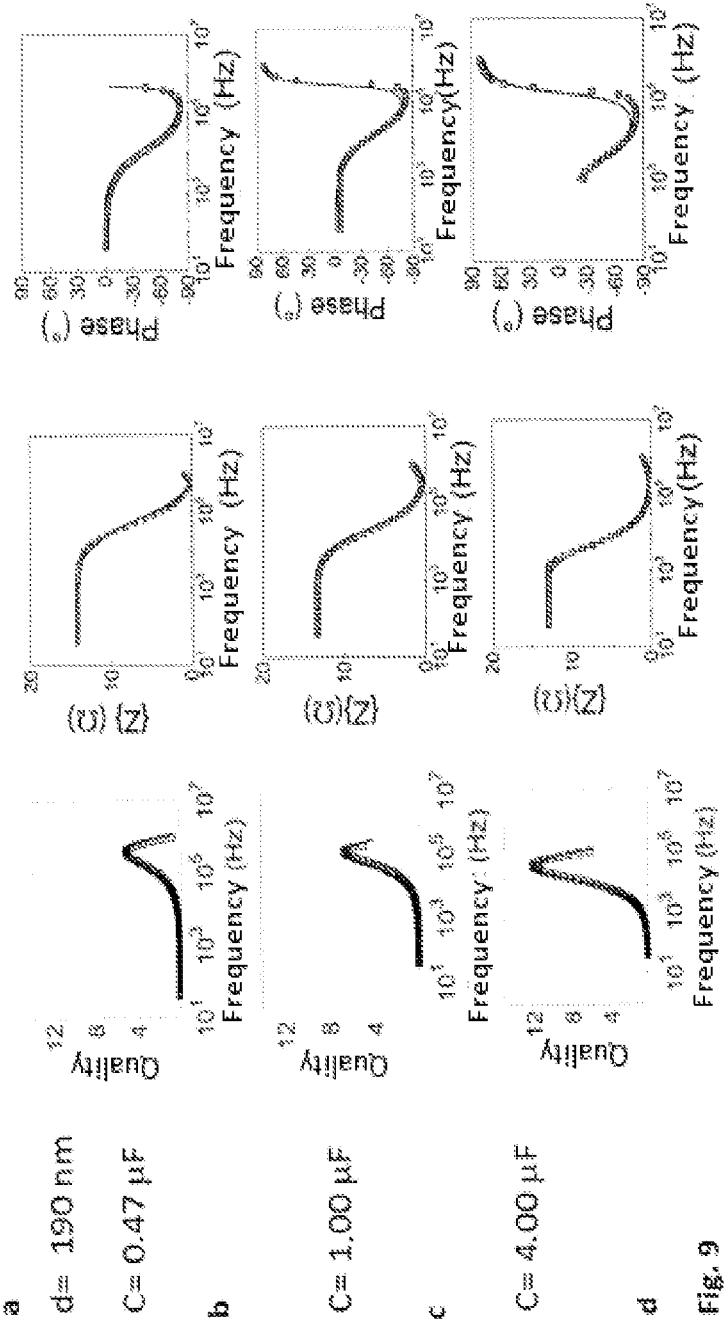
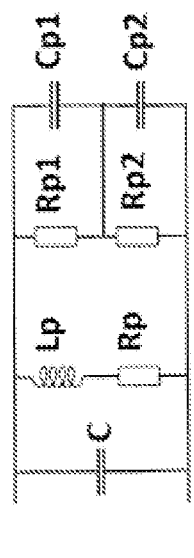
Fig. 9

US 12,034,424 B2

METHOD FOR THE RECONFIGURATION OF A VORTEX DENSITY IN A RARE EARTH MANGANATE, A NON-VOLATILE IMPEDANCE SWITCH AND USE THEREOF

CROSS REFERENCE TO RELATED APPLICATIONS

This application is the National Phase filing under 35 U.S.C. § 371 of International Application No. PCT/EP2019/061717, filed on May 7, 2019, and published on Nov. 28, 2019 as WO 2019/223999 A1, which claims priority to German Application No.: 10 2018 112 605.0, filed on May 25, 2018. The contents of each of the prior applications are hereby incorporated by reference herein in their entirety.

The invention relates to a method for reconfiguring a vortex density in a rare earth manganate.

BACKGROUND

The invention further relates to a nonvolatile impedance switch having a reconfigurable impedance.

The invention also relates to the use of the nonvolatile impedance switch as discrete component or as tunable filter.

SUMMARY OF THE INVENTION

Hybrid materials composed of metallically conducting paths in a dielectric are known from the prior art [Radio Frequency Integrated Circuits and Technologies, Frank Ellinger, Springer-Verlag Berlin Heidelberg, 2008], the impedance properties of which are determined during production by the geometry and volume properties of the metals and dielectrics. The metals are introduced in the form of metallically conducting paths into a dielectric, which gives rise to the term hybrid material since this configuration consists of at least two materials having different electrical conductivity properties. If such hybrid materials are used in electronic circuits, they have to have a quality factor of typically from 1 to 50 in the working frequency range [Radio Frequency Integrated Circuits and Technologies, Frank Ellinger, Springer-Verlag Berlin Heidelberg, 2008]. The working frequency range of discrete components composed of hybrid materials having metallically conducting paths in a dielectric is determined by the design and manufacture. The impedance properties of the discrete components composed of hybrid materials having metallically conducting paths in a dielectric cannot be changed after production. In order to alter impedance properties, for example the working frequency range, the discrete components composed of these hybrid materials having metallically conducting paths in a dielectric are used in an electronic circuit together with further discrete components but a reduction in the quality factor of the electronic circuit in the range of the working frequency of the discrete component composed of hybrid materials having metallically conducting paths in a dielectric is always observed.

Furthermore, in the prior art, inductances of from nH to pH represent a hindrance to the realization of small, highly integrated and energy-efficient voltage transformers because of the many orders of magnitude larger footprint of >$10^6$-$10^7$ $\mu m^2$.

Highly compact and energy-efficient voltage supplies are a basic prerequisite for high-performance microelectronic systems. For example, driver assistance systems require heterogeneous microcontroller and processor structures having an increasing number of different processor cores for data evaluation. The increasing power consumption associated therewith necessitates highly complex power management with parallelized, multiphase voltage transformers. The coils employed in each phase still dominate the construction size and often also the efficiency of the microcontroller and processor structures because of their large footprint. The term footprint refers to the physical dimensions of the inductance, for example on a substrate of an electronic circuit. Miniaturized inductive components would be more compact and energy-efficient and have a lower wiring requirement.

Inductive components known from the prior art are, for example, planar inductances having a magnetic core on a separate Si interposer, air core coils layerwise as part of the housing, lateral spiral coils made up of the upper metallization planes directly on the iC and magnetic core coils directly on the iC with use of the upper metal layers. A footprint of 111 nH/mm2 and efficiencies of about 75% are achieved by using of through-silicon vias (TSV).

Furthermore, what are known as YIG-based components which can be used in GHz filters or GHz resonators are known from the prior art. Yttrium-iron garnet, known as YIG or short, is a synthetic garnet having the composition $Y_3Fe_2(FeO_4)_3$ or $Y_3Fe_5O_{12}$. YIG is a ferrimagnetic insulator having a Curie temperature of 550 K. YIG displays a strong Faraday effect, i.e. a magnetooptical effect which describes the rotation of the plane of polarization of a linearly polarized electromagnetic wave in a medium when a magnetic field parallel to the direction of propagation of the wave prevails therein. YIG has a high quality in the microwave range and a very small line width in electron spin resonance. This material is therefore suitable for use in microwave, optical and magnetooptical applications, e.g. as frequency-determining element in the resonator of YIG oscillators and in YIG filters for frequencies in the gigahertz range.

If the yttrium-iron garnet is used as YIG resonator, it can have the shape of a small sphere having a diameter in the order of a few mm. To tune the resonant frequency, an external magnetic field HO is used. The resonant frequency of YIG filters is in the range f0=0.5 . . . 100 GHz and the resonator quality is about 104, since YIG has a very low damping constant. However, a disadvantage is that the YIG filter is very sensitive to temperature changes. For this purpose, the entire arrangement has to be heated during operation and kept at a constant operating temperature of 85° ° C. by means of a regulator. The resonant frequency is proportional to the applied field. The upper end of the tuning range of the resonant frequency of YIG-based components is limited essentially by the magnetic field HO which is able to be generated. The lower limit frequency arises from the condition that the internal magnetic field is positive and for a spherical shape is about 1.67 GHz. A further substantial disadvantage is the tunability of the resonant frequency by means of an external magnetic field because the arrangement for generating the external magnetic field cannot be miniaturized to the size of the YIG-based component and magnetic shielding of the YIG-based component together with the arrangement for generating the external magnetic field may be necessary for protecting further components.

It is therefore an object of the present invention firstly to provide a method by means of which the impedance of specific materials can be influenced and set without great difficultly as a function of a vortex density. A further object of the invention is to provide an impedance switch which can be reconfigured in a nonvolatile manner and can be used in tunable filters and resonators, with the disadvantages of the known discrete components composed of hybrid materials having metallically conducting paths in a dielectric and also the YIG components being avoided.

A further object is to realize microinductances having a low footprint (area required by the microinductance). For this purpose, a high vortex density is realized in the impedance switch. For example, the inductance density footprint of at present 100 nH/mm2 when using an electrode area on the impedance switch of 200 μm×200 μm can be increased by at least a factor of ten.

BRIEF DESCRIPTION OF THE DRAWING FIGURES

The object is achieved by a method for reconfiguring a vortex density in a rare earth manganate, wherein a one-off voltage-time profile is applied between a first and a second electrically conductive contact attached to the rare earth manganate, so that the rare earth manganate goes through an ordering temperature in a region of an electric field established between the two electrically conductive contacts during a cooling process during and after application of the one-off voltage-time profile and the vortex density is thus influenced and set locally in the region of the electric field established between the two electrically conductive contacts.

For the purposes of the present invention, a rare earth manganate is a material which forms vortex states on application of a voltage or on going through a heating and/or cooling process. A vortex state can be considered to be a point of intersection between charged domain walls within a material. Vortex states have already been able to be observed by means of transmission scanning electron microscopy in single-crystal hexagonal rare earth manganates (RMnO3, R=Ho . . . Lu and Sc) (FIG. 1$c$ in Direct Observation of Multiferroic Vortex Domains in YMnO3 Qinghua Zhang, Guotai Tan, Lin Gu, Yuan Yao, Changqing Jin, Yanguo Wang, Xiaofeng Duan, Richeng Yu, SCIENTIFIC REPORTS|3: 2741|DOI: 10.1038/srep02741). In these hexagonal rare earth manganates, vortex states are formed in the center of six different ferroelectric domain walls (DW), two charged DW (head-to-head), two charged DW (tail-to-tail) and two neutral DW (head-to-tail). A vortex state is topologically protected, i.e. it cannot be converted by continuous transformation into the base state. The ferroelectric ordering temperature Tc of the hexagonal rare earth manganates RMnO depends on the rare earth element in RMnO. Above a temperature of Tc, there is no establishment of ferroelectric order with ferroelectric domain walls and charged vortex states. For example, the ferroelectric ordering temperature for HoMnO3 is Tc=875 K, for LuMnO3 is Tc=573 K and for YMnO3 is Tc=930 K. On heating the hexagonal rare earth manganates RMnO3 above the ferroelectric ordering temperature, ferroelectric order is not apparent. The vortex density on subsequent cooling of the hexagonal rare earth manganates depends on the cooling rate at the point in time during the cooling process at which the cooling temperature is equal to the ferroelectric ordering temperature. Thus, vortex densities of 0.01 vortices/m$^2$ were achieved at a cooling rate of 10-3 K/min and of 1.00 vortices/m$^2$ were achieved at a cooling rate of 1 K/min in YMnO3 single crystals (FIG. 5 in From multiferroics to cosmology: Scaling behaviour and beyond in the hexagonal manganites, S. M. Griffin, M. Lilienblum, K. Delaney, Y. Kumagai, M. Fiebig, N. A. Spaldin, Phys. Rev. X 2, 041022, 2012]). Below the ferroelectric ordering temperature, the density of the vortices depends on the cooling rate. If a voltage having a predetermined amplitude is applied for a predetermined period of time to the at least two contacts which are fastened to a rare earth manganate, a current flows between the two contacts. Due to the electrical resistance of the rare earth manganate, part of the electric energy is converted into Joule heat and the rare earth manganate is heated up in the region between the electrically conductive contacts. If the input of Joule heat is so great that the rare earth manganate is heated to above the ferroelectric ordering temperature, the ferroelectric order is broken. The ferroelectric order is reestablished on cooling the rare earth manganates as soon as the temperature of the rare earth manganate is below the ferroelectric ordering temperature. The vortex density depends on the cooling rate on passing through the ferroelectric ordering temperature.

According to the invention, a voltage having a defined voltage-time profile is applied to a rare earth manganate between the first and second contact of the rare earth manganate. The voltage is applied with a predetermined amplitude and for a predetermined time to the contacts, so that an electric field is formed and flow of electric current occurs. As a result of the flow of electric current, the rare earth manganate becomes heated by means of Joule heat to above the ordering temperature characteristic of the material, so that domain walls and vortices present are broken up. The limiting of the time for which the voltage is applied, according to the selected voltage-time profile and control of the heating and cooling process by means of cooling and heating elements (insulation structures) brings about, after the voltage has been switched off, a cooling process whose temperature gradient is influenced and set firstly by means of the voltage-time profile used and secondly by insulation structures in which the rare earth manganate is embedded. Heat removal which is controlled over time can thus be realized. The profile of the applied voltage and the temperature gradient established have the effect that, during subsequent cooling of the material to below its characteristic ordering temperature, the vortex density which is established as a result of the controlled cooling process with a particular temperature gradient can be influenced so that the rare earth manganate displays inductive or capacitive behavior, depending on which behavior is to be configured.

In one embodiment of the method of the invention for reconfiguring the vortex density, the voltage-time profile is a voltage impulse or a voltage ramp. A voltage impulse is preferably used when switching between a rare earth manganate having a high or low vortex density is to be carried out quickly and in an energy-efficient manner. A voltage-time profile in the form of a voltage ramp is used when the magnitudes of the threshold voltages USET and URESET are not known, where USET is the value at which switching of the rare earth manganate from a state having a high ohmic resistance to a state having a low ohmic resistance occurs and URESET is the value at which the rare earth manganate switches over from a state having a low ohmic resistance to a state having a high ohmic resistance. If voltage impulses having amplitudes which are significantly greater than USET and URESET are used, then the rare earth manganate can be damaged in the region between the two electrically conductive contacts because of the high input of Joule heat.

Figure 13:
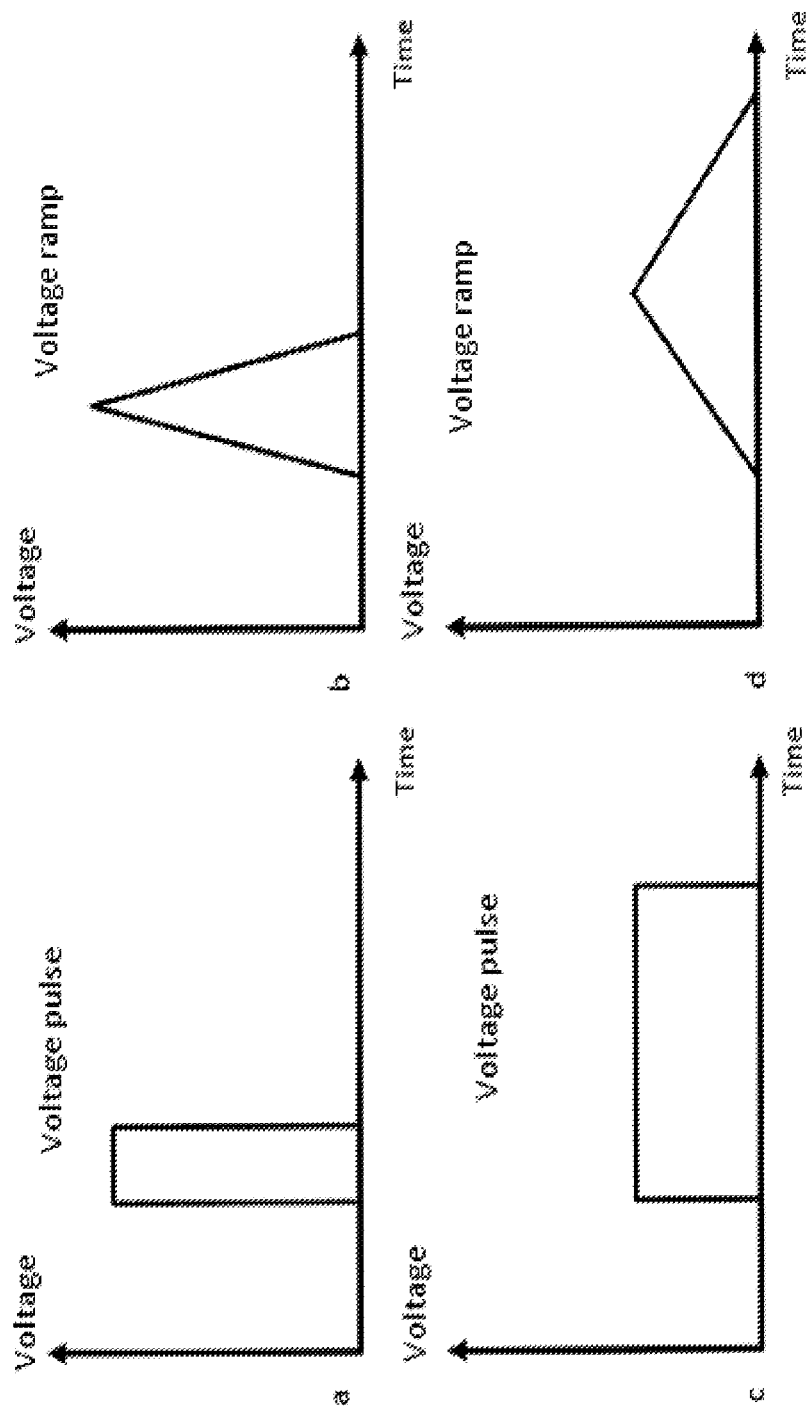

A voltage impulse can be advantageous compared to a voltage ramp (FIG. 13$b$, 13$d$) since it takes a comparatively long time to go through a voltage ramp compared to a voltage pulse (FIG. 13$a$, 13$c$). In addition, the rare earth manganate partially cools down again during application of the voltage ramp between the two electrically conductive contacts, so that only a small proportion of the electric energy introduced is converted into Joule heat. Two different cooling rates are achieved when passing through the ferroelectric ordering temperature during the cooling process in the case of the two alterable voltage profiles, for example using a voltage ramp and/or using a voltage pulse. The lower of the two cooling rates (voltage ramp) causes establishment of a low vortex density and the greater of the two cooling rates (voltage pulse) brings about establishment of a high vortex density in the rare earth manganate between the two electrically conductive contacts.

In a preferred embodiment of the method of the invention, a temperature gradient of greater than 1 K/min, preferably greater than 10 K/min, even more preferably greater than 100 K/min, is generated for reconfiguration of the vortex density with a resulting impedance having a dominant inductive reactance. To reconfigure the vortex density with a resulting impedance having a dominant inductive reactance (inductance L, $Z=R_{ON}+jwL$), a long voltage pulse having a large amplitude or a quick voltage ramp having a large amplitude is applied to the contacted layer sequence. This results in the formation of charged domain walls in a high density.

In another preferred embodiment of the method of the invention, a temperature gradient of less than 100 K/min, preferably less than 10 K/min, even more preferably less than 1 K/min, is generated for reconfiguration of the vortex density with a resulting impedance having a dominant capacitive reactance. To reconfigure the vortex density with a resulting impedance having a dominant capacitive reactance (capacitance C, $Z=R_{OFF}-j1/(wC)$), a short voltage impulse having a low amplitude or a slow voltage ramp having a small amplitude is applied to the contacted layer sequence. $R_{OFF}$ is greater than $R_{ON}$. The value of the capacitance C depends on the area A of the at least one contact and on the thickness of the rare earth manganate, i.e. a small contact area results in a low capacitance; a low thickness of the rare earth manganate results in a high capacitance.

The object is also achieved by a nonvolatile impedance switch reconfigured by the method of the invention for reconfiguring a vortex density, comprising a layer sequence consisting of at least one layer composed of a rare earth manganate and a first contact which is arranged on one side of the rare earth manganate and also a second contact which is arranged on the side opposite the first contact or on the same side as the first contact and also insulating structures for heat removal controlled over time and for setting of a temperature gradient while an ordering temperature of the rare earth manganate is gone through.

For the purposes of the present invention, a nonvolatile impedance switch is a component whose impedance properties can be repeatedly switched. The impedance, also referred to as AC resistance, is an electrical resistance in AC technology. It is the ratio of electric potential to current and, in particular, characterizes a phase shift between these two parameters. The impedance has, for example, importance in the adaptation of high-frequency power leads. When, for example, the input impedance of an appliance does not coincide with the impedance of the power lead, this results in reflections which reduce the power transmission and can lead to resonance phenomena and thus a nonlinear frequency response. The impedance, in cartesian coordinates $Z=R+jX$, is made up of a real part R for the resistance and an imaginary part for the reactance X. In a load having an inductance L, this has a positive (inductive) reactance; the voltage carries ahead of the current. Here, w is the circular frequency of the oscillation. In a load having a capacitance C, on the other hand, this has a negative (capacitive) reactance; the voltage follows the current.

For the purposes of the present invention, a layer composed of a rare earth manganate which has charged domain walls is a material or materials which form(s) what are known as vortex states below the ferroelectric ordering temperature Tc of the rare earth manganate. Above the ferroelectric ordering temperature, no ferroelectric order with ferroelectric domain walls and charged vortex states is formed. For example, the ferroelectric ordering temperature for $HoMnO_3$ is Tc=875 K, for $LuMnO_3$ is Tc=573 K and for $YMnO_3$ is Tc=930 K. On heating the hexagonal rare earth manganates $RMnO_3$ (R=Rare earth element) above the ferroelectric ordering temperature, ferroelectric order is not apparent. The vortex density of subsequent cooling of the rare earth manganates depends on the cooling rate at the point in time during the cooling process at which the cooling temperature is equal to the ferroelectric ordering temperature. Below the ferroelectric ordering temperature, vortices are formed. The vortex density depends on the cooling rate of the rare earth manganate when passing through the ferroelectric ordering temperature Tc. If a voltage having a predetermined amplitude is applied for a predetermined period of time to the at least two contacts which are fastened to a rare earth manganate, a current flows between the two contacts. Owing to the electrical resistance of the rare earth manganates, part of the electric energy is converted into Joule heat and the rare earth manganate is heated up. If the input of Joule heat is so great that the rare earth manganate is heated to above the ferroelectric ordering temperature, the ferroelectric order is broken down. The ferroelectric order is reestablished on cooling the rare earth manganates as soon as the temperature of the rare earth manganate is below the ferroelectric ordering temperature. The limiting of the time for which the voltage is applied brings about a cooling process whose temperature gradient can be influenced and set by means of a voltage-time profile used is brought about after switching off the voltage. The temperature gradient is likewise influenced and set by means of insulation structures present on the nonvolatile impedance switch of the invention. A controlled removal of heat can be realized in this way. The profile of the applied voltage and the temperature gradient established have the effect that, after switching off the applied voltage, the density of the charged domain walls, i.e. vortex density, which are formed with a particular temperature gradient as a result of the controlled cooling process during the subsequent cooling of the material below its characteristic ordering temperature, can be influenced in such a way that the nonvolatile impedance switch displays inductive or capacitive behavior depending on which behavior is to be configured.

In one embodiment of the nonvolatile impedance switch, at least one of the two contacts has a structured configuration. Application of a voltage to the two contacts results in the formation of an electric field. Owing to the structured contact, the vortex density can be influenced and set locally in a defined manner in a defined region of the at least one rare earth manganate layer.

Figure 4:
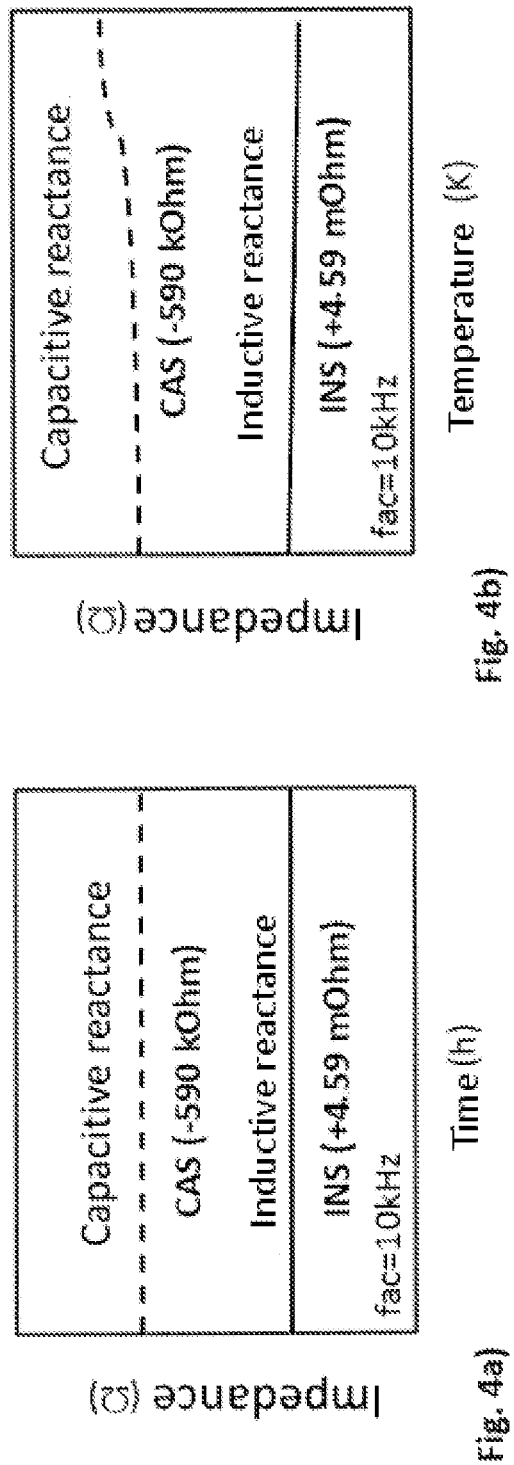

In a preferred embodiment of the nonvolatile impedance switch, the rare earth manganate is the material hexagonal $YMnO_3$. An advantage of tunable filters and resonators based on $YMnO_3$ impedance components compared to other tunable filters and resonators based on YIG which are known from the prior art is the nonvolatility of the tuning of the resonant frequency in a $YMnO_3$-based filter and resonator after one-off application of a voltage. The stability of the impedance state as a function of time (FIG. 4a) and as a function of the temperature (FIG. 4b) is shown in FIG. 4. An additional advantage is the integratability of the YMnO3-based components in a BEOL process in CMOS technology. A Back-End-Of-Line (BEOL) process is the second part of iC manufacture, in which the individual components (transistors, capacitors, resistors, etc.) are connected with the wiring on the wafer, the metallization layer. In a BEOL process, contacts, insulating layers (dielectrics), metal planes and bonding positions for chip-to-housing connections are made.

In an embodiment of the nonvolatile impedance switch of the invention, the thickness of the layer sequence is greater than 5 nm and less than 5000 nm. These limits are advantageous because the vortex density in the rare earth layer should be homogeneous between the front side electrode and rear side electrode so that the impedance properties which are dependent on the vortex density are homogeneous between the front side electrode and the rear side electrode.

In a further particularly advantageous embodiment of the nonvolatile impedance switch of the invention, the first contact and/or the second contact has an area of from 101 to 105 $\mu m^2$, preferably an area of from 101 to 103 $\mu m^2$. This has the advantage that it is in this way possible to realize a significantly higher inductance density than has hitherto been the case. The realization of small, highly integrated and energy-efficient voltage transformers is thus possible.

The impedance switch can be switched between an inductive rare earth manganate and a capacitive rare earth manganate by means of the embodiments indicated above. These two impedance states differ significantly in terms of their complex impedance, their quality, the resonant frequency and the phase behavior. For example, it is advantageous in the case of a phase shifter for the resonant frequency and the phase behavior to be able to take on any impedance values by application of a voltage-time profile.

It is particularly advantageous for the nonvolatile impedance switch to be used as discrete component in an electronic circuit for adapting a phase shift.

It is also advantageous for the nonvolatile impedance switch to be used as tunable filter.

It is particularly advantageous for the nonvolatile impedance switch to be used as two-pin component for discrete passive components. The advantage is the small footprint of from 103 to 105 $\mu m^2$ or the even smaller footprint of from 101 to 103 $\mu m^2$.

It is likewise particularly advantageous to use the nonvolatile impedance switch as flip chip for integration into circuits for energy-efficient phase transformers.

The invention will be illustrated in greater detail below with the aid of working examples.

The drawings show:

FIG. 1 nonvolatile impedance switch of the invention with charged domain walls (and insulation structures)—unconfigured (a) with an electrode on the front side and an electrode on the rear side, (b) with two electrodes on the front side, (c) hexagonal domain structure with vortex in the center;

FIG. 2a-2b a) nonvolatile impedance switch of the invention with charged domain walls and low vortex density and dominant capacitive reactance, b) nonvolatile impedance switch of the invention with charged domain walls and high vortex density and dominant inductive reactance;

FIG. 3 frequency-dependent behavior of the configured impedance switch;

FIG. 4a-4b confirmation of the nonvolatility of a) the reactance of the impedance switch and b) the temperature stability thereof;

FIG. 5a-5d modeling of the measured complex impedance Z with dominant inductive reactance;

FIG. 6a-6d modeling of the measured complex impedance Z with dominant capacitive reactance;

FIG. 7a-7d comparison between modeling and measurement results for the quality factor and the resonant frequency for material in the low-resistance state (LRS) having a thickness d=110 nm and connected external capacitances of different values;

FIG. 8a-8d comparison between modeling and measurement results for the quality factor and the resonant frequency for material in the low-resistance state (LRS) having a thickness d=160 nm and connected external capacitances of different sizes;

FIG. 9a-9d comparison between modeling and measurement results for the quality factor and the resonant frequency for material in the low-resistance state (LRS) having a thickness d=190 nm and connected external capacitances of different sizes;

FIG. 10a-10d comparison between modeling and measurement results for the quality factor and the resonant frequency for material in the high-resistance state (HRS) having a thickness d=110 nm and connected external inductances of different sizes;

FIG. 11a-11d comparison between modeling and measurement results for the quality factor and the resonant frequency for material in the high-resistance state (HRS) having a thickness d=160 nm and connected external inductances of different sizes;

FIG. 12a-12d comparison between modeling and measurement results for the quality factor and the resonant frequency for material in the high-resistance state (HRS) having a thickness d=190 nm and connected external inductances of different sizes;

FIG. 13a-13d voltage-time profiles: a) short voltage pulse, b) short voltage ramp, c) long voltage pulse, d) long voltage ramp.

FIG. 1 shows the schematic structure of the nonvolatile impedance switch 1 of the invention composed of a rare earth manganate 4 with charged domain walls 5 and insulation structures 8. In one possible embodiment, an electrically conductive rear side contact 2 has been deposited on the layer sequence on a substrate layer 6 by means of thin film technology. The total thickness of the layer sequence in tunable electrical resonators and filters should be greater than 5 nm and less than 5000 nm. Finally, an electrically conductive front side contact 3 has been applied to the opposite side of the rear side contact 2. The second contact 3 can also be applied to the same side as the rear side contact 2 on the layer sequence 4. At least one of the two contacts 2, 3, i.e. either the front side contact 3 and/or the rear side contact 2, is structured. The layer sequence 4 comprises at least one layer which has charged domain walls 5. This layer is a rare earth manganate, for example YMnO3. In the production process, the material is typically heated to a substrate temperature below the ferroelectric ordering temperature, resulting in the vortex 7 density being established spontaneously.

FIG. 2a shows the nonvolatile impedance switch 1 of the invention with charged domain walls 5 having a lower vortex 7 density and dominant capacitive reactance. As a result of the application of a short voltage pulse of high amplitude to the contacted layer sequence, charged domain walls 5 having a high vortex 7 density are formed.

FIG. 2b shows the nonvolatile impedance switch of the invention with charged domain walls 5 of high density and dominant inductive reactance. As a result of application of a long voltage pulse of low amplitude to the contacted layer sequence, charged domain walls having a low vortex 7 density are formed.

FIG. 3 shows the frequency-dependent behavior of the configured impedance switch 1 in a frequency range from 1 kHz to 40 MHz. After application of the threshold voltage USET, the resistance of the rare earth manganate thin layer switches from high (HRS: high-resistance state) to low (LRS: low-resistance state). After application of the threshold voltage URESET, the resistance of the rare earth manganate thin layer switches from low (LRS) to high (HRS).

FIGS. 4a and 4b show that the impedance of the impedance switch 1 of the invention is independent of time and temperature, i.e. the impedance behavior can be set in a nonvolatile manner.

FIG. 5a depicts an equivalent circuit of the material having charged domain walls 5 for modeling the measured complex impedance Z with dominant inductive reactance. Essentially, modeling is done by an inductance Lp in series with a resistance Rp and, parallel thereto, two (Rp, Cp) pairs (Rp1, Cp1 and Rp2, Cp2). The impedance and the quality factor as depicted in FIGS. 5b to 5d were modeled by the equivalent circuit shown in FIG. 5a. The modeled values of the parallel capacitance Cp1 and Cp2 and also the parallel resistances Rp1 and Rp2 decrease with the thickness of the material of the at least one layer. The inductance Lp and the quality factor Qmax increase with increasing thickness. The measured and modeled quality factors and impedance data are shown for the material having a thickness of d=110 nm (FIG. 5b), d=160 nm (FIG. 5c) and d=190 nm (FIG. 5d).

Figure 5:
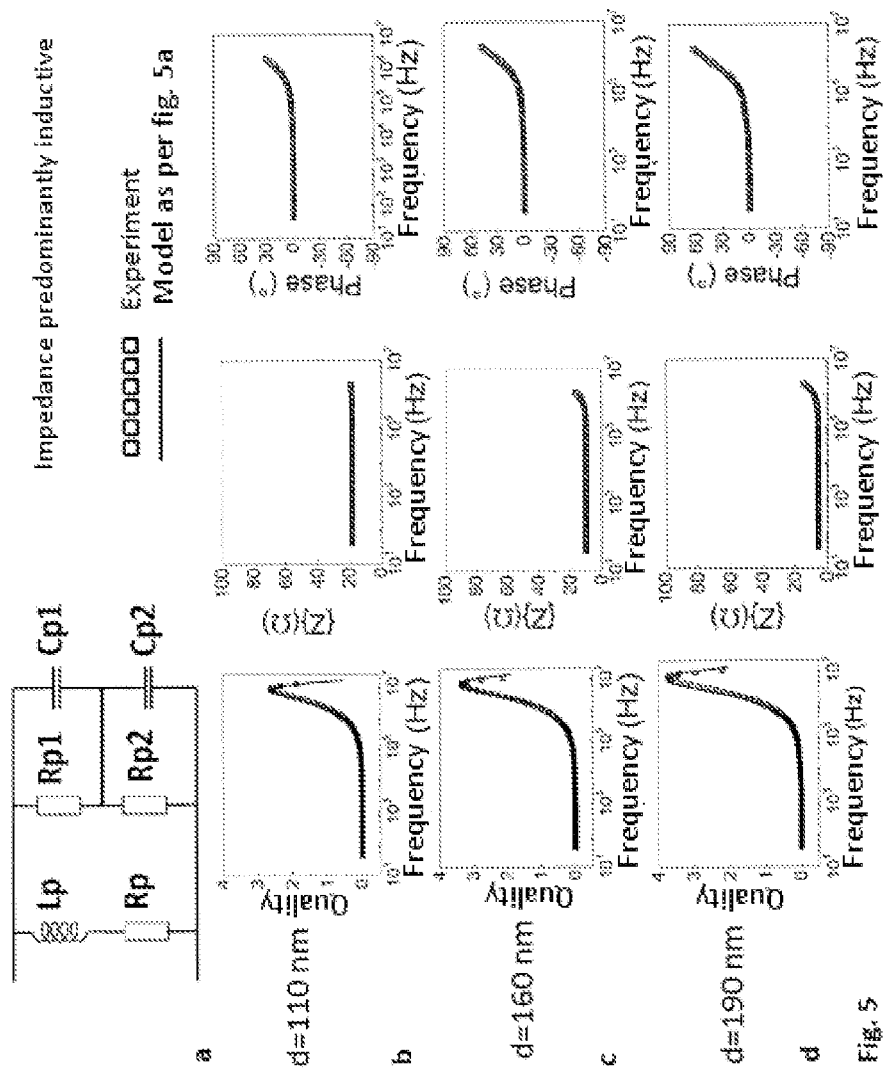

Table 1 shows the modeled values of the equivalent circuit of the material having a thickness of d=110 nm, 160 nm and 190 nm in the LRS with charged domain walls, as per FIG. 5.

TABLE 1

Modeling of the impedance and the quality factor in FIG. 5.

| LRS | | YMO 110 nm | YMO 160 nm | YMO 190 nm |
|---|---|---|---|---|
| Impedance-modeled | $Cp_1$ | 240 pF | 182 pF | 145 pF |
| | $Rp_1$ | 750 Ω | 308.6 Ω | 176 Ω |
| | $Cp_2$ | 270 pF | 201 pF | 118 pF |
| | $Rp_2$ | 275.1 Ω | 250 Ω | 185 Ω |
| | RLp | 17.85 Ω | 9.51 Ω | 4.92 Ω |
| | Lp | 1016.2 nH | 1045.75 nH | 1064.37 nH |
| Quality factor-modeled | $Cp_1$ | 265 pF | 182 pF | 119 pF |
| | $Rp_1$ | 770 Ω | 305 Ω | 116 Ω |
| | $Cp_2$ | 277 pF | 141 pF | 101 pF |
| | $Rp_2$ | 280 Ω | 250 Ω | 175 Ω |
| | RLp | 9.85 Ω | 7.31 Ω | 4.72 Ω |
| | Lp | 1010.37 nH | 1041.05 nH | 1051.3 nH |
| | $Q_{max}$ | 2.61 | 3.36 | 3.70 |

FIG. 6a depicts an equivalent circuit of the material having charged domain walls in order to model the measured complex impedance Z with dominant capacitive reactance (FIG. 6a). Essentially, modeling is effected by two (Rp, Cp) pairs ($Rp_1$, $Cp_1$ and $Rp_2$, $Cp_2$). The impedance and the quality factor were modeled by means of the equivalent circuit depicted in FIG. 6a. The modeled values of the parallel capacitance $Cp_1$ and $Cp_2$ decrease with the thickness of the material of the at least one layer. The parallel resistances $Rp_1$ and $Rp_2$ and the quality factor $Q_{max}$ increase with the thickness of the material. The measured and modelled quality factors and impedance data are shown for the material having a thickness of d=110 nm (FIG. 6b), d=160 nm (FIG. 6c) and d=190 nm (FIG. 6d).

Figure 6:
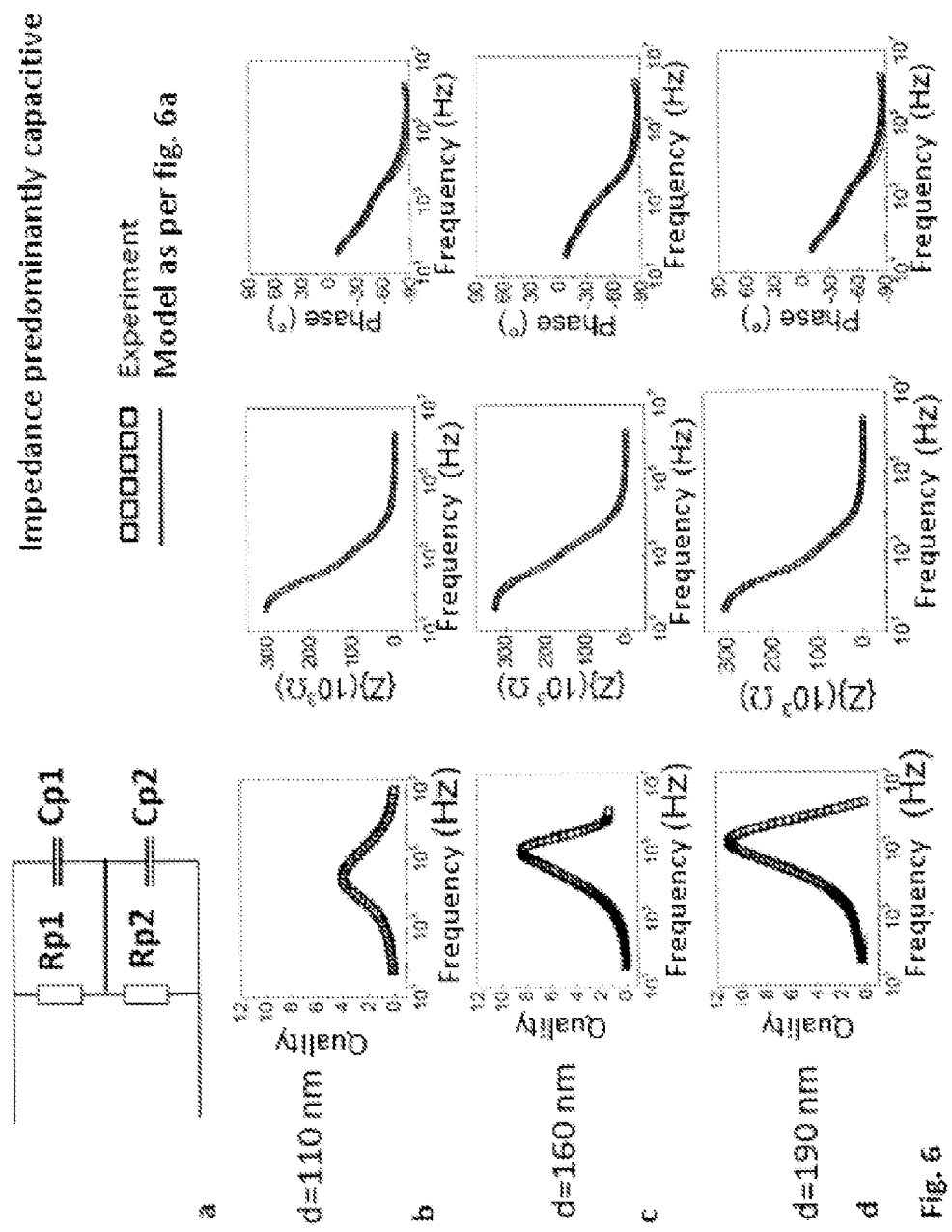

Table 2 shows the modeled values of the equivalent circuit of the material having a thickness of d=110 nm, 160 nm and 190 nm in the HRS with charged domain walls, as per FIG. 6.

TABLE 2

Modeling of the impedance and the quality factor in FIG. 6.

| HRS | | YMO 110 nm | YMO 160 nm | YMO 190 nm |
|---|---|---|---|---|
| Impedance-modeled | $Cp_1$ | 980 pF | 780 pF | 130 pF |
| | $Rp_1$ | 262500 Ω | 282500 Ω | 302500 Ω |
| | $Cp_2$ | 294 pF | 190 pF | 50 pF |
| | $Rp_2$ | 770 Ω | 1770 Ω | 2270 Ω |
| Quality factor-modeled | $Cp_1$ | 540 pF | 200 pF | 140 pF |
| | $Rp_1$ | 265500 Ω | 310500 Ω | 350500 Ω |
| | $Cp_2$ | 100 pF | 50 pF | 10 pF |
| | $Rp_2$ | 550 Ω | 1000 Ω | 5400 Ω |
| | $Q_{max}$ | 3.965 | 8.775 | 11.05 |

Figure 7:
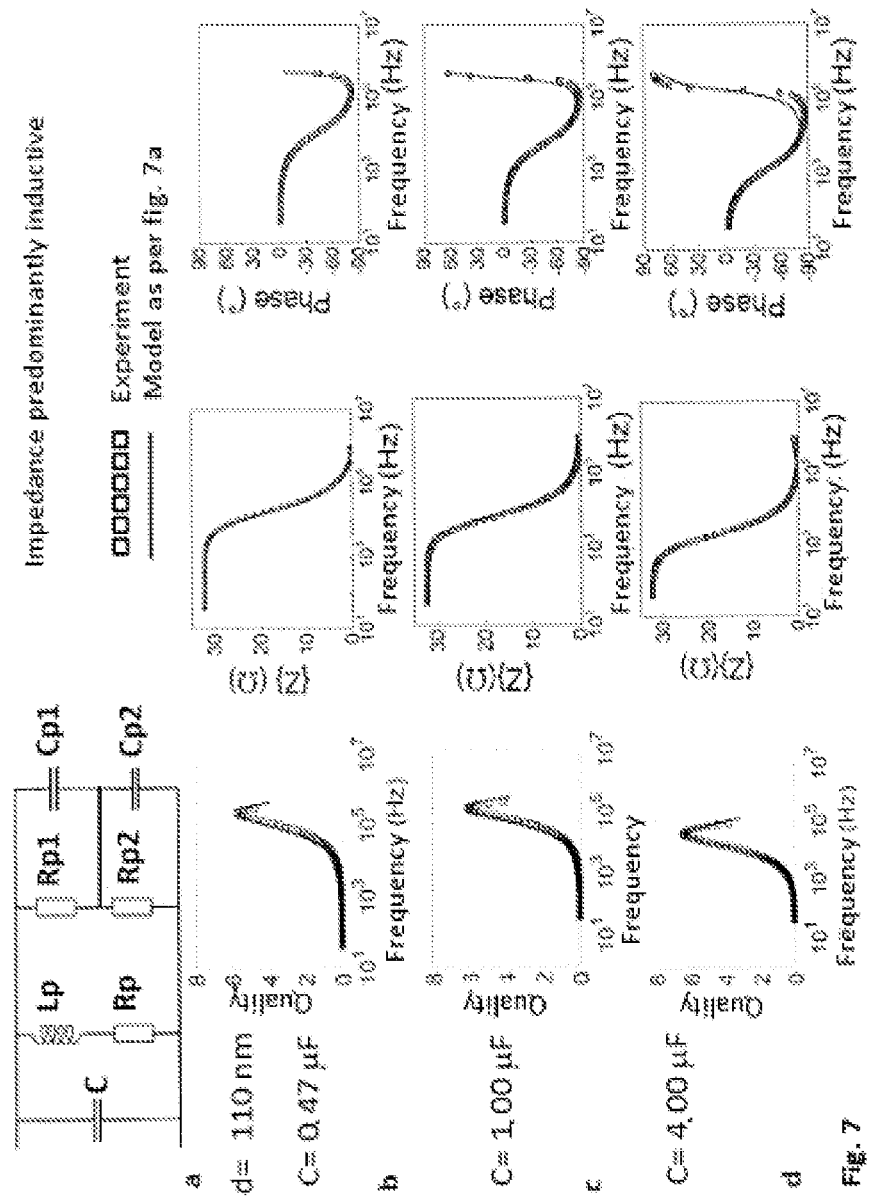
Figure 8:
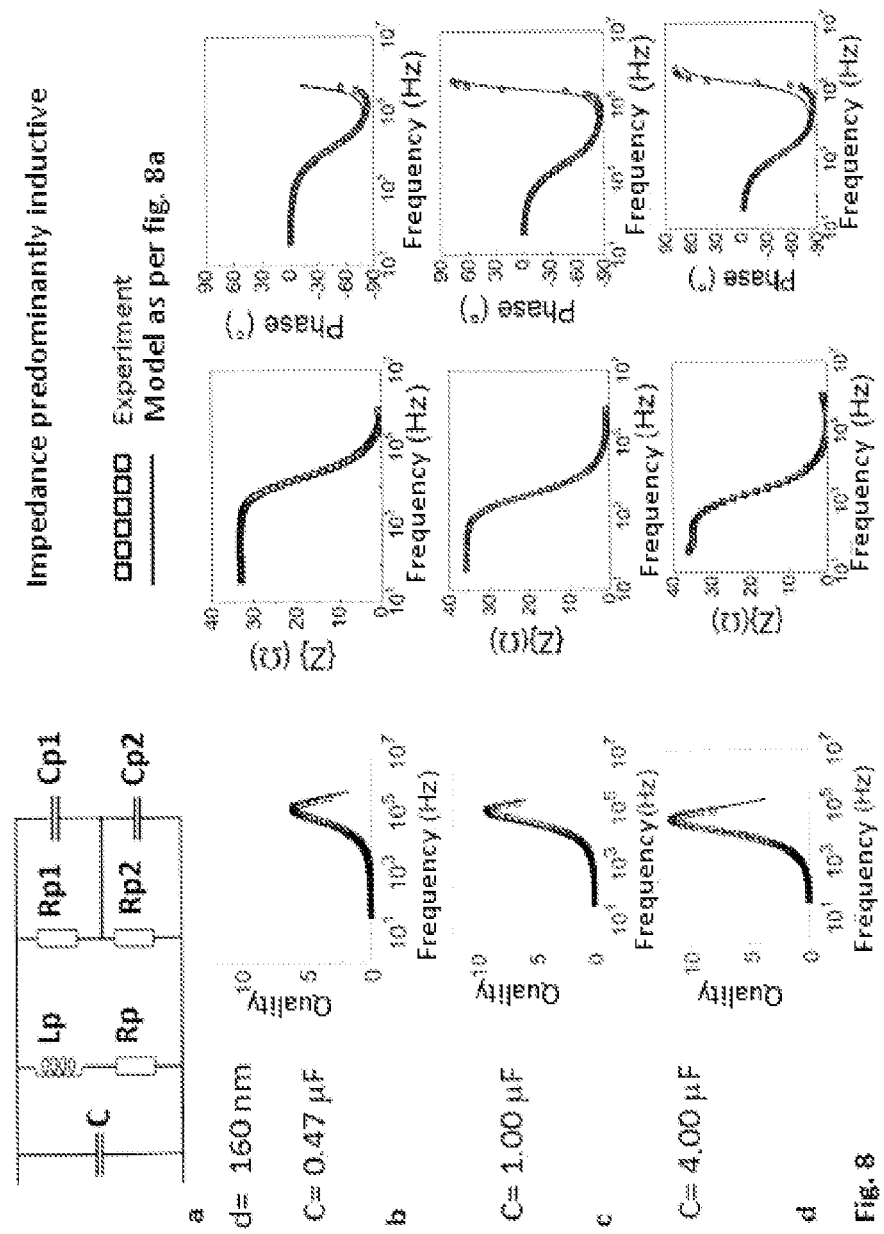

The quality factor and the resonant frequency are set in a controlled manner by means of discrete electronic components supplemented in parallel. This is shown for the material in the LRS having charged domain walls having a thickness of d=110 nm (FIG. 7), d=160 nm (FIG. 8) and d=190 nm (FIG. 9) with different external capacitances C=0.47 μF (FIGS. 7b, 8b, 9b), C=1.00 μF (FIGS. 7c, 8c, 9c) and C=4.00 μF (FIGS. 7d, 8d, 9d). The quality factors and impedance data measured with an external capacitance C were modeled for the material having domain walls in the LRS using the equivalent circuits shown in FIGS. 7a, 8a, 9a, with the external capacitance C being entered with its nominal value into the model.

Figure 10:
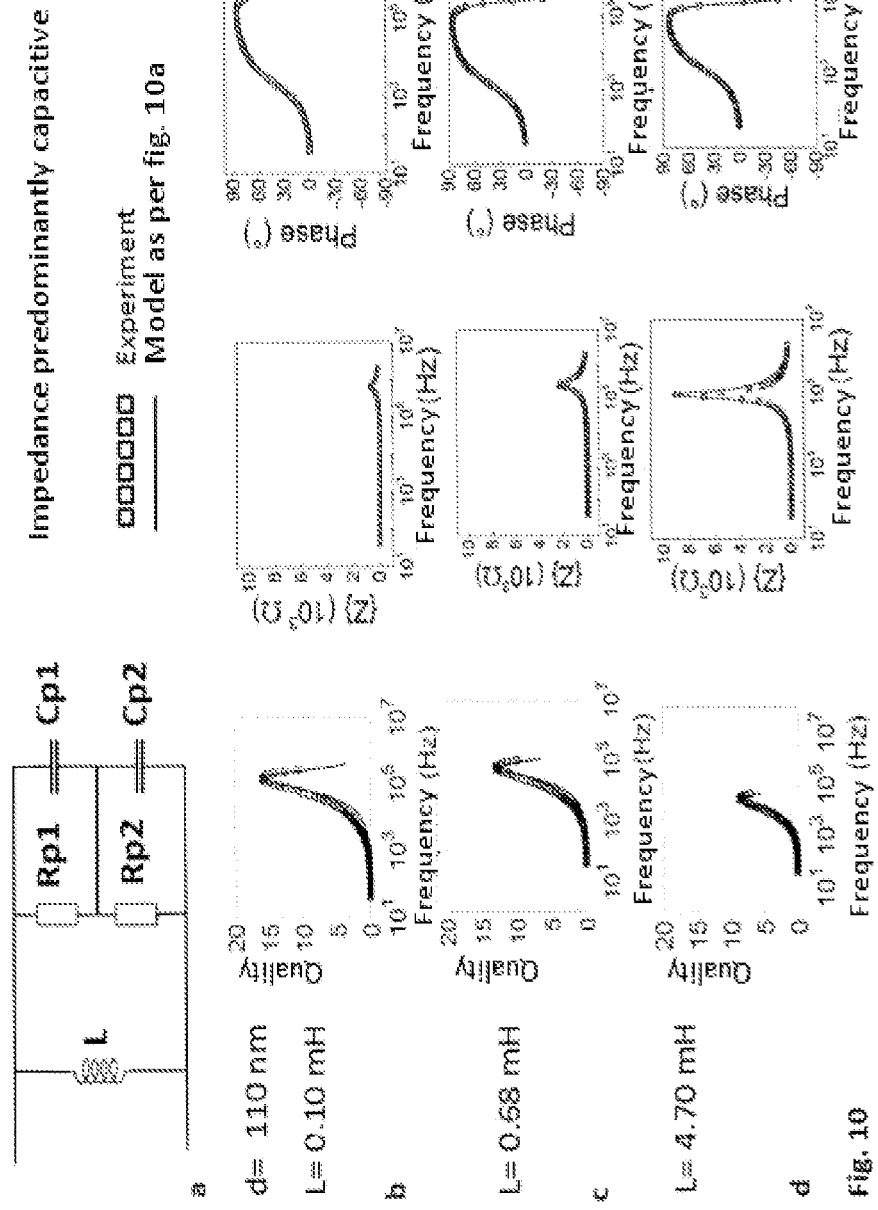
Figure 11:
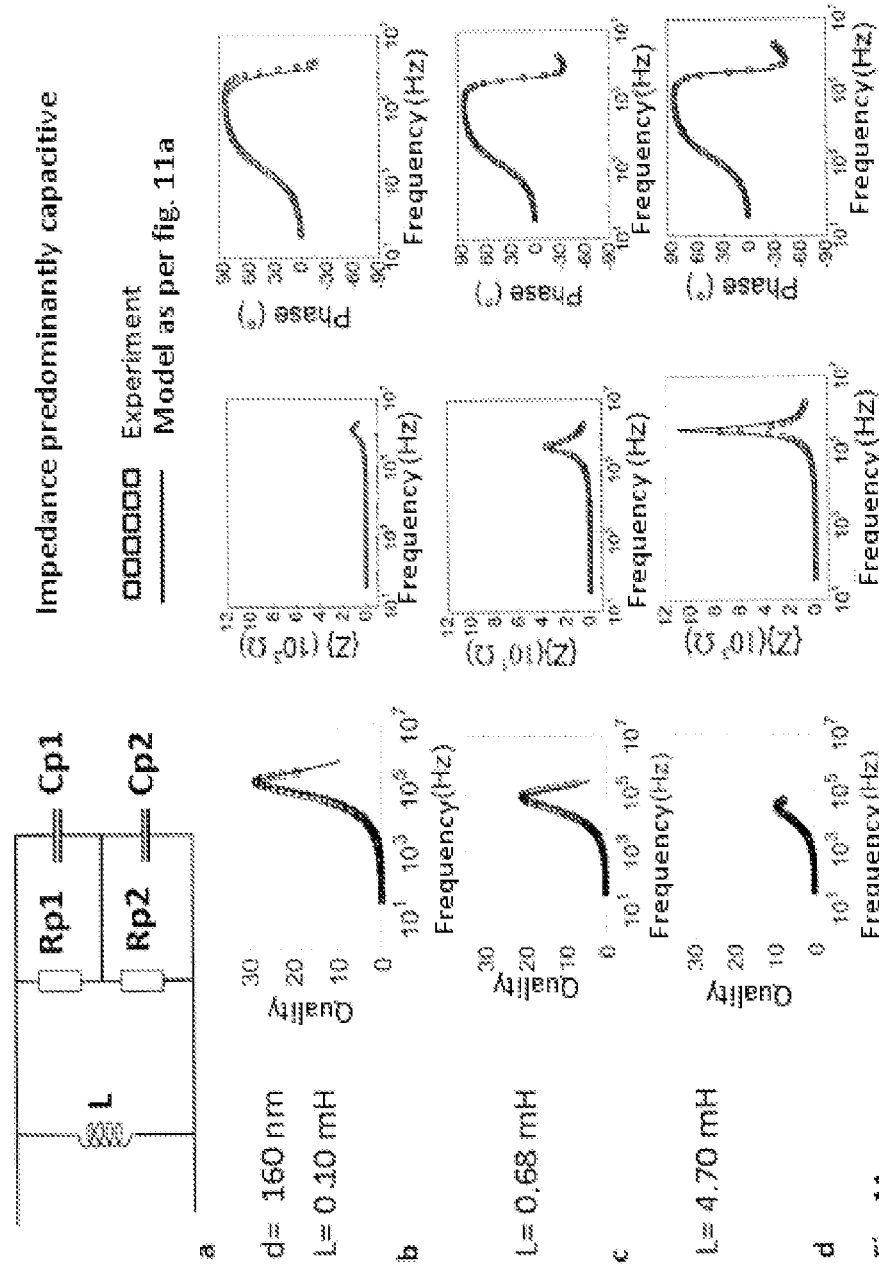
Figure 12:
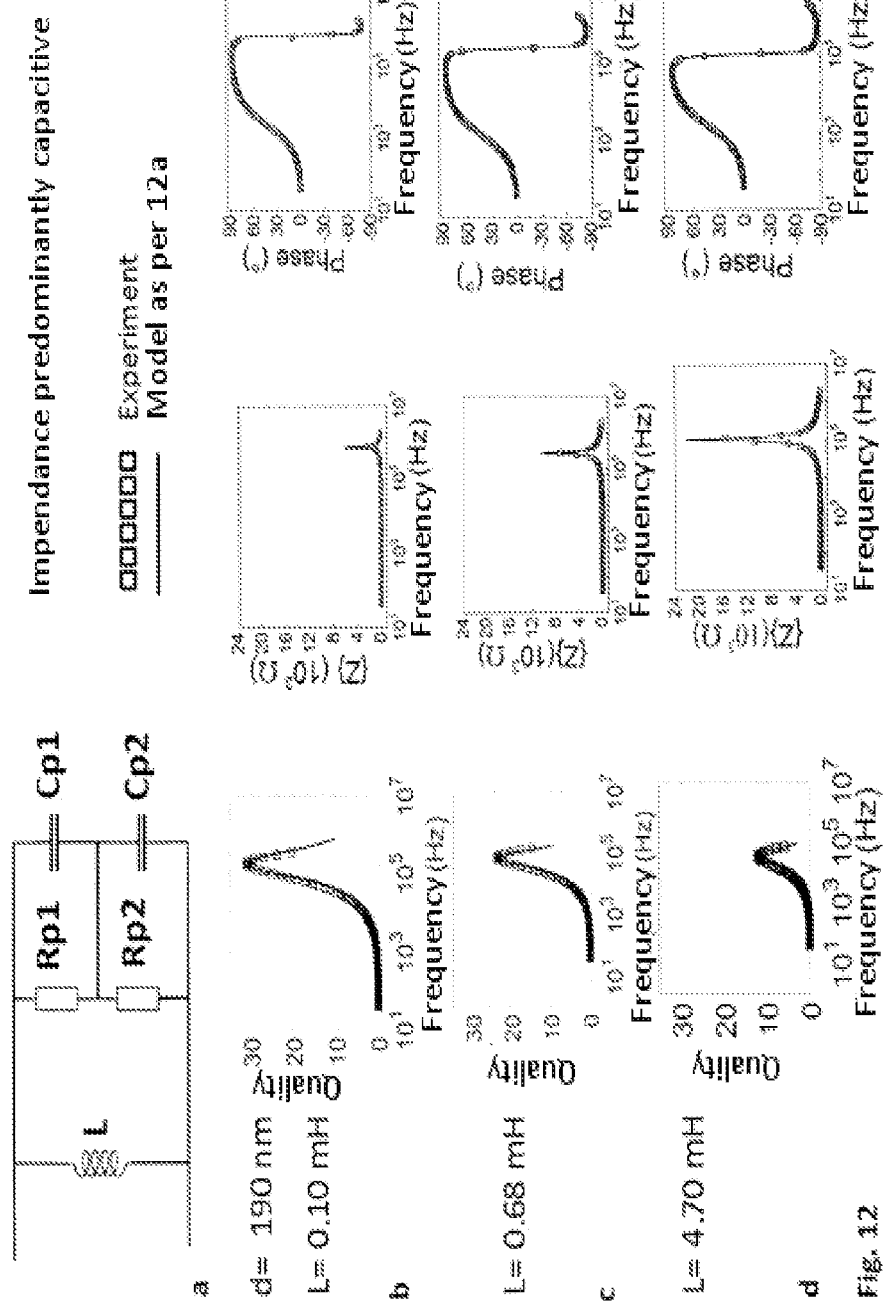

This is also shown for the material in the HRS having charged domain walls 5 having a thickness of d=110 nm (FIG. 10), d=160 nm (FIG. 11) and d=190 nm (FIG. 12) with different external inductances L=0.10 mH (FIGS. 10b, 11b, 12b), L=0.68 mH (FIGS. 10c, 11c, 12c) and C=4.00 mH (FIGS. 10d, 11d, 12d). The quality factors and impedance data measured with an external inductance L were modeled for the material having domain walls 5 in the HRS using the equivalent circuits shown in FIGS. 10a, 11a, 12a, with the external inductance L being entered with its nominal value in the model.

LIST OF REFERENCE SYMBOLS

1 Non-volatile impedance switch
2 First contact
3 Second contact
4 Layer sequence containing charged domain walls, rare earth manganate
5 Charged domain walls
6 Substrate
7 Vortex
8 Insulation structure
9 Heating and/or cooling element
d Thickness of the layer sequence

The invention claimed is:
1. A method for reconfiguring a vortex density in a rare earth manganate comprising:
applying a one-off voltage-time profile between a first and a second electrically conductive contact of the rare earth manganate attached to the rare earth manganate;
allowing a cooling process so that the rare earth manganate goes through an ordering temperature in a region of an electric field established between the two electrically conductive contacts during and after application of the one-off voltage-time profile; and wherein the vortex density is thus influenced and set locally in the region of the electric field established between the two electrically conductive contacts, and a temperature gradient of either: (i) greater than 1 K/min, preferably greater than 10 K/min, more preferably greater than 100 K/min, is generated for reconfiguring the vortex density with a resulting impedance having a dominant inductive reactance, or (ii) less than 100 K/min, preferably less than 10 K/min, more preferably less than 1 K/min, is generated for reconfiguring the vortex density with a resulting impedance having a dominant capacitive reactance.

2. The method for reconfiguring a vortex density in a rare earth manganate as claimed in claim 1, wherein the voltage-time profile is a voltage impulse or a voltage ramp.

3. The method for reconfiguring a vortex density as claimed in claim 1, wherein the temperature gradient is preferably greater than 10 K/min, more preferably greater than 100 K/min.

4. The method for reconfiguring a vortex density as claimed in claim 1, wherein the temperature gradient is preferably less than 10 K/min, more preferably less than 1 K/min.

5. A nonvolatile impedance switch having a vortex density reconfigured by the method as claimed in claim 1, comprising a layer sequence consisting of at least one layer composed of a rare earth manganate and a first contact which is arranged on one side of the rare earth manganate and also a second contact which is arranged on the side opposite the first contact or on the same side as the first contact and also insulating structures for heat removal controlled over time and for setting of a temperature gradient while an ordering temperature of the rare earth manganate is gone through.

6. The nonvolatile impedance switch as claimed in claim 5, wherein at least one of the two contacts has a structured configuration.

7. The nonvolatile impedance switch as claimed in claim 6, wherein the rare earth manganate is the material hexagonal $YMnO_3$.

8. The nonvolatile impedance switch as claimed in claim 5, wherein the rare earth manganate is the material hexagonal $YMnO_3$.

9. The nonvolatile impedance switch as claimed in claim 8, wherein the thickness of the layer sequence is greater than 5 nm and less than 5000 nm.

10. The nonvolatile impedance switch as claimed in claim 5, wherein the thickness of the layer sequence is greater than 5 nm and less than 5000 nm.

11. The nonvolatile impedance switch as claimed in claim 10, wherein the first contact and/or second contact has an area of from $10^1$ to $10^5$ $\mu m^2$, preferably an area of from $10^1$ to $10^3$ $\mu m^2$.

12. The nonvolatile impedance switch as claimed in claim 5, wherein the first contact and/or second contact has an area of from $10^1$ to $10^5$ $\mu m^2$, preferably an area of from $10^1$ to $10^3$ $\mu m^2$.

13. The nonvolatile impedance switch as claimed in claim 12 wherein the impedance switch is configured as tunable filter.

14. The nonvolatile impedance switch as claimed in claim 12 wherein the impedance switch is configured as two-pin component for discrete passive components or as flip chip for integration into circuits for energy-efficient voltage transformers.

15. The nonvolatile impedance switch as claimed in claim 5 wherein the impedance switch is incorporated as discrete component in an electronic circuit for adapting a phase shift.

16. The nonvolatile impedance switch as claimed in claim 5 wherein the impedance switch is configured as tunable filter.

17. The nonvolatile impedance switch as claimed in claim 5 wherein the impedance switch is configured as two-pin component for discrete passive components.

18. The nonvolatile impedance switch as claimed in claim 5 wherein the impedance switch is configured as flip chip for integration into circuits for energy-efficient voltage transformers.

19. The method for reconfiguring a vortex density as claimed in claim 1, wherein a temperature gradient of greater than 1 K/min, preferably greater than 10 K/min, more preferably greater than 100 K/min, is generated for reconfiguring the vortex density with a resulting impedance having a dominant inductive reactance.

20. The method for reconfiguring a vortex density as claimed in claim 1, wherein a temperature gradient of less than 100 K/min, preferably less than 10 K/min, more preferably less than 1 K/min, is generated for reconfiguring the vortex density with a resulting impedance having a dominant capacitive reactance.

* * * * *